Nov. 22, 1966 L. SCHWARTZ 3,287,606

PACKAGING DEVICE FOR READILY RECEIVING AND REMOVING ELECTRICAL COMPONENTS HAVING A PLURALITY OF CONNECTING LEADS

Filed Dec. 16, 1964

INVENTOR
LEON SCHWARTZ

BY William E. Cleaver

ATTORNEY

United States Patent Office 3,287,606

Patented Nov. 22, 1966

3,287,606

PACKAGING DEVICE FOR READILY RECEIVING AND REMOVING ELECTRICAL COMPONENTS HAVING A PLURALITY OF CONNECTING LEADS

Leon Schwartz, Philadelphia, Pa., assignor to Sperry Rand Corporation, New York, N.Y., a corporation of Delaware Filed Dec. 16, 1964, Ser. No. 418,721
2 Claims. (Cl. 317—101)

This invention relates to means for packaging electronic circuits and more particularly to packaging means which will enable electronic components held therein to be readily removed and replaced when necessary.

In packaging electronic circuits it has become the practice to "sandwich" the circuit components, i.e., the transistors, integrated circuits, diodes, resistor networks and the like, between printed-circuit boards. The circuit components have been disposed within the package and the lead wires from the circuit components have been connected to the printed circuit lead positions. The printed circuit boards, normally, have been held separated by interconnecting wires or riser pins. Once such an electronic circuit package was fabricated, in the prior art, and a circuit component became faulty, it was virtually impossible, or in the alternative, too costly, to undo the packages and replace the faulty components, hence, the practice has been to scrap the electronic package.

The present invention provides an electronic circuit package which allows for easy removal of faulty circuit components which are sandwiched within the package, without an accompanying disassembly of the entire package or any part thereof.

Accordingly, it is an object of the present invention to provide an improved packaging means for packaging electronic circuits.

It is a further object of the present invention to provide an electronic circuit package which permits easy removal and replacement of circuit components which are held within the package.

In accordance with a feature of the present invention, the printed circuit boards which sandwich the circuit components, such as integrated circuits, etc., have portions cut from their peripheries in the form of slits, and into these slits the lead-in wires of the electronic components are located and connected to the terminals of the printed circuits.

In accordance with another feature of the present invention the slits, or cut-away portions, of the last feature are disposed with respect to the circuit boards such that they do not interfere with the positions of the riser pins which are used for rigidity of the package and for interconnecting the logic wiring from one level to another.

The foregoing and other objects and features of this invention will be best understood by reference to the following description of the embodiment of the invention taken in conjunction with the accompanying drawings, wherein.

In general, the present invention provides an electronic package which lends itself to easy mounting and easy removal of circuit components held within the package. In the prior art the circuit components such as transistors, integrated circuits, etc. were held within a pair of printed circuits. The printed circuits were held displaced from one another by riser pins and the riser pins were generally disposed around the periphery of the package. The electronic circuits were mounted within the package and were extremely difficult to get at whenever one of the circuit components failed. The present invention provides that the printed circuit boards, which sandwich the circuit components, have slits cut into their periphery and the printed circuits are so arranged that their connecting terminals overlap the last-mentioned slits. Accordingly, the leads of the circuit components are slipped into the slits on the top and the bottom of the package and are soldered to the terminals of the printed circuit of the logic boards. In the event that one of the components becomes faulty it is a simple matter to cut off the soldered sections at the printed circuit terminals and remove the circuit component. With equal ease the removed circuit component can be readily replaced with a similar circuit component. In this way there is a vast saving of packages since the package is not discarded and obviously there is a saving of expense in utilizing this type of electronic circuit package.

Figure 1:
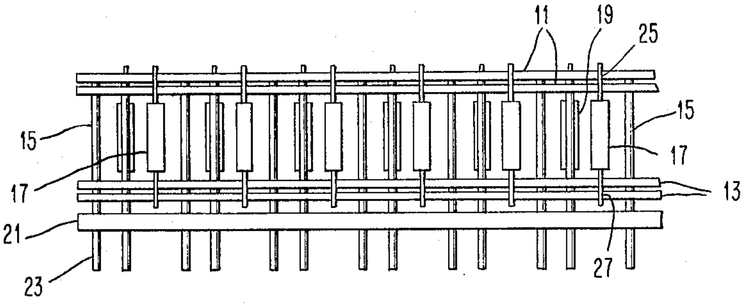
FIGURE 1 is a front elevation of the electronic package.

The foregoing general description is better understood by examining FIGURE 1 which shows a pictorial of the present electronic circuit package. In FIGURE 1 there are shown printed circuit boards 11 and 13 in a double board pattern. The printed circuit patterns per se are not shown but it should be understood that ohmic, conductive paths run between the terminals of one slit and the terminals of other slits. The double board pattern is used in order to provide cross-over means for the printed circuits or in order to provide extra printed circuit terminals, but it should be understood that if there were no necessity for cross-overs, a single printed-circuit board could be used. On the other hand, multiple layer printed-circuit boards (laminated boards) may be used if the cross-overs or extra terminals cannot be accommodated by a pair of boards.

In FIGURE 1 there are also shown riser pins 15 which are used to hold the upper printed circuit boards 11 displaced from the lower printed circuit boards 13. The riser pins will become better understood in connection with FIGURE 2, also serve to provide connections between the upper and lower boards where such connections are advantageous. In addition, the riser pins are used to connect into the female sockets of the backboard plane wherein this configuration is advantageous. Sandwiched between the printed circuit boards 11 and 13 there are shown (in FIGURE 1) many circuit components such as circuit components 17 and 19.

Assume that the component 17 is an integrated circuit which is to be connected to some other components within the package and further connected to additional circuitry through the backboard plane 21 via the prongs 23. The printed circuit boards would be so arranged that the terminals thereof would overlap the slit 25 and the slit 27. The lead in termials of the component 17 would be made in an extended fashion so that they could be located in the slits 25 and 27 and hence be in a position to be connected to the printed board circuit terminals which overlap the slits.

Figure 2:
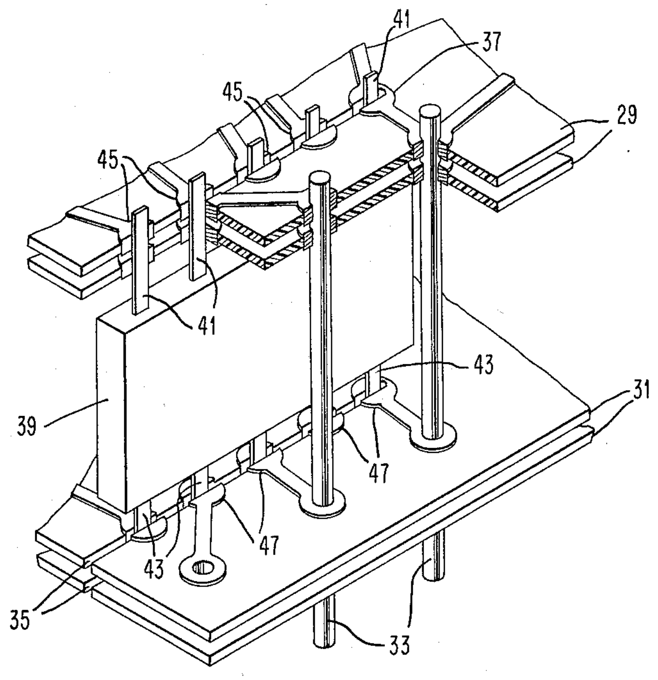
FIGURE 2 is a partial pictorial view showing the relationship between the slits, the circuit boards and the risers.

The foregoing arrangement of the circuit component with the circuit boards can be better appreciated from FIGURE 2 which shows an upper pair of circuit boards 29 and a lower pair of circuit boards 31. Two riser pins 33 hold the circuit boards 29 apart from the circuit boards 31. In circuit boards 31 there are cut a pair of slots 35 while in the circuit boards 29 there are cut a pair of slots 37. The circuit boards 29 are shown in sectional view to show how the riser pins and the leads from the circuit component 39 can be connected to the terminals 45 of the printed circuit boards 29.

Into the slots 35 and 37, the component 39 (which may represent a transistor package, an integrated circuit, or a resistor network) is inserted. The lead-in wires 41 and 43 of the electronic component are disposed to extend beyond the top of the circuit board such that they can be readily soldered or connected to the circuit board terminals 45 and 47.

It becomes obvious that if the electronic component 39 should become faulty, the lead wires can simply be cut or soldered from the circuit board terminals 45 and 47 and the component 39 can be moved to the left out of the slot and in effect removed from the circuit package. Thereafter, a similar component can be obtained and set into the slots 37 and 35 and reconnected by soldering or the like to the printed circuit board terminals. It also is obvious from FIGURE 2 that the riser pins 33 can serve to connect circuit paths from the upper boards to the lower boards which connections may represent a direct ohmage or low impedance connection between two such paths.

The present invention provides that the electronic components can be readily removed from the circuit package and therefore readily replaced.

While I have described above the principles of my invention in connection with specific apparatus, it is to be clearly understood that this description is made only by way of example and not as a limitation to the scope of my invention as set forth in the objects thereof and the accompanying claims.

The embodiments of an invention in which an exclusive property or privilege is claimed are defined as follows:

1. An electronic circuit package comprising:

(a) at least first and second printed circuit boards, each having terminal means for having electrical devices connected thereto, each of said printed circuit boards having substantially long slits cut therein with said slits commencing at the periphery thereof;

(b) a plurality of electrical devices, each having at least first and second sides lying opposite from each other and each of said sides having at least two electrical connecting leads, each of said electrical devices having the electrical connecting leads of its first side disposed in an assigned slit of said first printed circuit board and having the electrical connecting leads of its second side disposed in an assigned slit of said second printed circuit board, said electrical connecting leads of said first and second sides being respectively connected to said first and second printed circuit boards in proximity to their respectively assigned slots; and (c) riser pins rigidly connected to said first and second printed circuit boards to hold said printed circuit boards displaced from one another and simultaneously being connected to the printed circuits of said printed circuit boards to make electrical connections between the printed circuits of said first printed circuit board and printed circuits of said second printed circuit board.

2. An electronic circuit package comprising:

(a) at least first and second printed circuit boards, each having terminal means for having electrical devices connected thereto, each of said printed circuit boards having a plurality of substantially long slits cut therein with said slits commencing at the periphery thereof;

(b) riser pins rigidly connected to said first and second printed circuit boards to hold said printed circuit boards displaced from one another and simultaneously being connected to the printed circuits of said printed circuit boards to make electrical connections between the printed circuits of said first printed circuit board and the printed circuits of said second printed circuit board;

(c) said first and second printed circuit boards being formed such that every electrical device connected therebetween has its respective connecting leads disposed in an associated one of said plurality of slits; and (d) a plurality of electrical devices each having at least first and second sides lying opposite from each other and each of said sides having at least two electrical connecting leads thereon, each of said electrical devices having the connecting leads of its first side disposed in an associated slit of said first printed circuit board and having the connecting leads of its second side disposed in an associated slit of said second printed circuit board, said leads of said first and second sides being respectively connected to said first and second printed circuit boards in proximity to their respectively associated slots.

References Cited by the Examiner

UNITED STATES PATENTS 2,699,133 1/1955 Ames et al. ---------- 317—101

FOREIGN PATENTS 242,157 12/1962 Australia.

799,015 7/1958 Great Britain.

ROBERT K. SCHAEFER, *Primary Examiner.*

W. C. GARVERT, *Assistant Examiner.*